(12) United States Patent
Doorenbos et al.

(10) Patent No.: US 7,504,977 B2
(45) Date of Patent: Mar. 17, 2009

(54) HYBRID DELTA-SIGMA/SAR ANALOG TO DIGITAL CONVERTER AND METHODS FOR USING SUCH

(75) Inventors: Jerry L. Doorenbos, Tucson, AZ (US); Marco A. Gardner, Tucson, AZ (US); Dimitar T. Trifonov, Vail, AZ (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/738,566

(22) Filed: Apr. 23, 2007

(65) Prior Publication Data

US 2008/0258951 A1  Oct. 23, 2008

(51) Int. Cl.
*H03M 3/00* (2006.01)
(52) U.S. Cl. .................... 341/143; 341/122; 341/155; 341/156; 341/172
(58) Field of Classification Search ............... 341/118, 341/120, 143, 155, 172
See application file for complete search history.

(56) References Cited

U.S. PATENT DOCUMENTS

| | | | |
|---|---|---|---|
| 5,195,827 A | | 3/1993 | Audy |
| 5,221,926 A | * | 6/1993 | Jackson .................. 341/118 |
| 5,345,236 A | * | 9/1994 | Sramek, Jr. ............... 341/144 |
| 5,617,090 A | * | 4/1997 | Ma et al. .................. 341/141 |
| 5,644,308 A | * | 7/1997 | Kerth et al. .............. 341/120 |
| 5,867,012 A | | 2/1999 | Tuthill |
| 5,982,221 A | | 11/1999 | Tuthill |
| 6,097,239 A | | 8/2000 | Miranda, Jr. et al. |
| 6,133,753 A | | 10/2000 | Thomson et al. |
| 6,169,442 B1 | | 1/2001 | Meehan et al. |
| 6,847,321 B1 | * | 1/2005 | Pentakota et al. .......... 341/156 |
| 6,884,840 B2 | * | 4/2005 | Gleichenhagen et al. ..... 524/832 |
| 6,970,118 B2 | * | 11/2005 | Regier ...................... 341/118 |
| 6,970,126 B1 | * | 11/2005 | O'Dowd et al. ............. 341/172 |
| 7,015,853 B1 | * | 3/2006 | Wolff et al. ................ 341/155 |
| 2005/0140538 A1 | * | 6/2005 | Shekar ...................... 341/163 |
| 2005/0162296 A1 | * | 7/2005 | Koe et al. .................. 341/143 |

OTHER PUBLICATIONS

Analog Devices Data Sheet, 10-Bit Temperature Sensor (AD7416) and Four Single ADCs (AD7417/AD7418), 2004, printed from www.analog.com Apr. 10, 2007.

Analog Devices Data Sheet TMP401, Low Power Programmable Temperature Controller, 2002, printed from www.analog.com Apr. 10, 2007.

(Continued)

*Primary Examiner*—Linh V Nguyen
(74) *Attorney, Agent, or Firm*—John J. Patti; Wade J. Brady, III; Frederick J. Telecky, Jr.

(57) ABSTRACT

Various systems and methods for capturing data are disclosed. For example, some embodiments of the present invention provide methods for performing a first analog to digital conversion using a delta-sigma based analog to digital converter, and performing a second analog to digital conversion using a SAR based analog to digital converter. The delta-sigma converter provides a first portion of a conversion result, and the SAR based analog to digital converter provides a second portion of the conversion result. The methods further include combining the first portion of the conversion result with the second portion of the conversion result to produce a combined conversion result.

21 Claims, 6 Drawing Sheets

OTHER PUBLICATIONS

Texas Instruments Data Sheet TMP401, +/−1C Programmable Remote/Local Digital Out Temperature Sensor, Aug. 2006, printed from www.ti.com Apr. 10, 2007.

Doorenbos et al., Texas Instruments Data Sheet TMP411, +/−1C Remote and Local Temperature Sensor with N-Factor and Series Resistance Correction, Feb. 2007.

SMSC Data Sheet, EMC1023 1C Triple Temperature Sensor with Resistance Error Correction, Dec. 3, 2004.

U.S. Appl. No. 11/738,571, filed Apr. 23, 2007, Gardner et al.

U.S. Appl. No. 11/738,584, filed Apr. 23, 2007, Gardner et al.

U.S. Appl. No. 11/738,595, filed Apr. 23, 2007, Doorenbos et al.

Analog Devices Data Sheet, +/− 1C Remote and Local System Temperature Monitor (ADM1032), 2005, printed from analog.com, May 24, 2007.

Analog Devices Data Sheet, +/− C Temperature Monitor with Series Resistance Cancellation (ADT7461), 2005, printed from analog.com, May 24, 2007.

Maxim Data Sheet, Remote/Local Temperature Sensor with SMBus Serial Interface, (MAX1617A), Jan. 1999, printed from www.maxim-ic.com, May 24, 2007.

Pertijs et al. "A Cmos Smart Temperature Sensor" IEEE J. Solid-State Circuits, vol. 40, No. 12, Dec. 2005.

SMSC Data Sheet 1 Degree D Triple SMbus Sensor with Resistance Error Correction, (EMC1033), Jan. 2007, printed from www.smsc.com.

\* cited by examiner

HYBRID DELTA-SIGMA/SAR ANALOG TO DIGITAL CONVERTER AND METHODS FOR USING SUCH

BACKGROUND OF THE INVENTION

The present invention is related to data conversion, and more particularly to analog to digital converters.

Various analog to digital data converters and conversion techniques have been developed over the years for converting electrical signals from an analog domain to a digital domain. In general, the process of analog to digital conversion includes sampling an analog signal and comparing the sampled analog signal to a threshold value. A binary result is recorded depending upon the result of the comparison. The process of comparing the sample against a threshold may be repeated a number of times with each successive comparison using a different threshold and residue of the sample. The number of iterations typically affects the noise level of any result as well as the resolution of the ultimate digital signal.

Some analog to digital converters rely on delta-sigma modulation techniques. FIG. 1a is a conceptual diagram of a first order delta-sigma analog to digital converter 100. Analog to digital converter 100 includes an operational amplifier 110, a comparator 120, and a counter 130. A positive input of operational amplifier 110 is electrically coupled to ground. A negative input of operational amplifier 110 is electrically coupled to a reference sample capacitor 156 and an input sample capacitor 166. Reference sample capacitor 156 is electrically coupled to a negative version of a voltage reference 150 via a switch 152, and to ground via a switch 154. Input sample capacitor 162 is electrically coupled to a voltage input 160 via a switch 162 and to ground via a switch 164. A feedback capacitor 116 is electrically coupled between the output and the negative input of operational amplifier 110 by way of a switch 114. Another switch 112 allows for shorting the output of operational amplifier 110 to the negative input thereof.

In operation, voltage input 160 is sampled by closing switch 162 and switch 112. This allows input sample capacitor 166 to be charged to a level reflecting voltage input 160. The charge from input sample capacitor 166 is then transferred to feedback capacitor 116 by opening switch 162 and switch 112, and closing switch 114 and switch 164. This results in an output from operational amplifier 110 at the input of comparator 120. Where the gain of operational amplifier 110 is unity, the output is approximately equal to voltage input 160. The output is compared with voltage reference 150. Where the result is a logic '0', counter 130 is not incremented. In the next pass, voltage input 160 is again sampled by closing switch 162 and switch 112. Once charging is complete, charge is transferred from capacitor 166 to capacitor 116 by closing switch 114 and switch 164. This results in a value of approximately double voltage input 160 at the output of operational amplifier 110. Again, where the result is a logic '0', counter 130 is not incremented and substantially the same process is repeated until the result of a logic '1' is achieved.

Alternatively, on any pass where the result of the comparison is a logic '1', counter 130 is incremented. Further, where the result is a logic '1', the negative version of the voltage reference 150 is sampled along with voltage input 160 on the next pass. This is done by closing switch 152, switch 162 and switch 112. This causes charge to build up on reference sample capacitor 156 representing the negative reference voltage, and charge to build up on input sample capacitor 166 representing input voltage 160. The charge from both of the aforementioned capacitors is transferred to feedback capacitor 116 by closing switch 114, switch 154 and switch 164. By continually re-sampling input voltage 160 and sampling the negative voltage reference any time a logic '1' is noted, the following residue will remain for a counter value of X and a number of iterations N:

$$\text{Residue} = NV_{in} - XV_{ref}.$$

The digital value representing the voltage input is that maintained on counter 130 at the end of the process. The process may be continued for a large number of iterations which would result in a progressively finer resolution. Unfortunately, the number of samples (N) to create a defined output resolution of ADC result 140 increases exponentially. For example, for a ten bit resolution one thousand, twenty-four ($2^{10}$) samples are required. In comparison, for a twenty bit resolution, over one million samples are required ($2^{20}$). Thus, while analog to digital converter 100 is capable of providing accurate results, results exhibiting relatively high resolution require substantial conversion time.

Other approaches for analog to digital conversion exist. Turning to FIG. 1b, a conceptual diagram of a SAR based analog to digital converter 170 is shown. As shown, SAR based analog to digital converter 170 includes a comparator 175 and a shift register 185 that provides an ADC result 190. In operation, a voltage input 180 is compared with one half of a voltage reference 194. Where the voltage input is greater than one half of the voltage reference 194, a logic '1' is shifted into shift register 185. Alternatively, where the voltage input is less than one half of the voltage reference 194, a logic '0' is shifted into shift register 185.

Next, where the previous comparison indicated that voltage input 180 is greater than one half of the voltage reference 194, voltage input 180 is compared with one half of the voltage reference 194 augmented with one quarter of the voltage reference 196 by an adder 172 (i.e., voltage input 180 is compared with three quarters of the voltage reference). Again, where the comparison indicates a greater than condition, a logic '1' is shifted into shift register 185. In contrast, where the comparison indicates a less than condition, a logic '0' is shifted into shift register 185.

Alternatively, where the previous comparison indicated that voltage input 180 is less than one half of the voltage reference 194, voltage input 180 is compared with one half of the voltage reference 194 decremented by one quarter of the voltage reference 196 by an adder 172 (i.e., voltage input 180 is compared with one quarter of the voltage reference). Again, where the comparison indicates a greater than condition, a logic '1' is shifted into shift register 185. In contrast, where the comparison indicates a less than condition, a logic '0' is shifted into shift register 185. This process is continued for lower order multiples of the voltage reference. As will be appreciated, the aforementioned process is capable of providing ADC result 190 with a very high resolution in a relatively small amount of time. In particular, only a single iteration is required to produce each bit of resolution. For example, for a ten bit resolution ten iterations are required, and for twenty bits of resolution only twenty iterations are required. Thus, while analog to digital converter 170 is capable of providing quick results, the results are often inaccurate due to noise.

Thus, for at least the aforementioned reasons, there exists a need in the art for advanced systems and devices for analog to digital conversion.

BRIEF SUMMARY OF THE INVENTION

The present invention is related to data conversion, and more particularly to analog to digital converters.

Various systems and methods for capturing data are disclosed. For example, some embodiments of the present invention provide methods for performing a first analog to digital conversion using a delta-sigma based analog to digital converter, and performing a second analog to digital conversion using a SAR based analog to digital converter. The delta-sigma converter provides a first portion of a conversion result, and the SAR based analog to digital converter provides a second portion of the conversion result. The methods further include combining the first portion of the conversion result with the second portion of the conversion result to produce a combined conversion result.

In some instances of the aforementioned embodiments, the delta sigma converter further provides a conversion residue. In such instances, the second analog to digital conversion operates on the conversion residue. Further, in some such instances, combining the first portion of the conversion result with the second portion of the conversion result includes identifying the first portion of the conversion result as the most significant bits of the combined conversion result and identifying the second portion of the conversion result as the least significant bits of the combined conversion result. In other such instances, combining the first portion of the conversion result with the second portion of the conversion result includes adding the first portion of the conversion result to the second portion of the conversion result. Adding the first portion of the conversion result to the second portion of the conversion result includes shifting such that one or more most significant bits of the second portion of the conversion result are added to one or more least significant bits of the first portion of the conversion result. In one particular case, the combined conversion result exhibits a resolution of a certain number of bits. The resolution is defined by a number of bits in the first portion of the conversion result and the second portion of the conversion result.

In some instances of the aforementioned embodiments, performing the first analog to digital conversion using the delta-sigma based analog to digital converter includes performing a number of analog to digital conversion iterations. In such cases, the number of analog to digital conversion iterations is greater than a number of bits in the combined conversion result. In various instances of the aforementioned embodiments, performing the second analog to digital conversion using the SAR based analog to digital converter includes performing a number of analog to digital conversion iterations. In such cases, the number of analog to digital conversion iterations is less than the number of bits in the combined conversion result.

In some instances of the aforementioned embodiments, the methods further comprise providing an analog to digital conversion circuit that is configurable as both a delta-sigma based analog to digital converter and a SAR based analog to digital converter. In some such instances, the analog to digital conversion circuit includes a comparator and an operational amplifier. Both the comparator and the operational amplifier are used in both the delta-sigma based analog to digital converter and the SAR based analog to digital converter.

Other embodiments of the present invention provide analog to digital converters. Such analog to digital converters include a first stage and a second stage. The first stage provides a first result and a residue, and operates as a delta-sigma based analog to digital converter. The second stage receives the residue and provides a second result; and the second stage operates as a SAR based analog to digital converter. In some instances of the aforementioned embodiments, the first stage includes an operational amplifier and a comparator. This operational amplifier may be a differential operational amplifier, and the comparator may be a differential comparator. The output of the operational amplifier is electrically coupled to an input of the comparator. In some cases, the second stage reuses the same operational amplifier and comparator. In various instances, the first stage includes a result counter that is driven by an output of the comparator. The second stage includes a result register that is driven by an output of the comparator.

In various instances of the aforementioned embodiments, the SAR based analog to digital converter produces a single bit of resolution for each SAR cycle. In such instances, the SAR based analog to digital converter may utilize a window comparator. Such a window comparator may include two comparators operable to detect an input in excess of an upper threshold, an input less than a lower threshold, and a window condition above the lower threshold and below the upper threshold. In other instances of the aforementioned embodiments, the SAR based analog to digital converter produces a single bit of resolution for each two SAR cycles. In some such instances, a single threshold comparator may be used. In various instances of the aforementioned embodiments, the first stage includes an input capacitor and a feedback capacitor, and the second stage reuses the same input capacitor and feedback capacitor. In some such cases, the second stage exhibits a positive feedback with a gain based on a ratio of the input capacitor and the feedback capacitor.

Yet other embodiments of the present invention provide analog to digital converters that include an operational amplifier, a comparator and a feedback capacitor. An output of the operational amplifier is electrically coupled to an input of the comparator. The analog to digital converter further includes a group of switches that are selectable to configure the operational amplifier, the comparator and the feedback capacitor in a first operational mode, and are further selectable to configure the operational amplifier, the comparator and the feedback capacitor in a second operational mode. The first operational mode is a delta-sigma based analog to digital converter, and the second operational mode is operation as a SAR based analog to digital converter. In various instances of the aforementioned embodiments, there are two groups of switches with one of the groups of switches being configurable to electrically couple the feedback capacitor between a negative input of the operational amplifier and the output of the operational amplifier. In some such cases, the negative input of the operational amplifier is further electrically coupled to a reference sample capacitor and an input sample capacitor. Further, the aforementioned group of switches are further selectable to electrically couple a reference voltage to the reference sample capacitor, and selectable to electrically couple a ground to the reference sample capacitor.

In particular instances of the aforementioned embodiments, the analog to digital converter is a differential analog to digital converter. In such instances, the feedback capacitor is a first feedback capacitor, the operational amplifier includes a differential output, and the differential output is provided to a differential input of the comparator. In such cases, the differential analog to digital converter further comprises: a second feedback capacitor; and the group of switches are selectable to configure the operational amplifier, the comparator, the first feedback capacitor and the second feedback capacitor in a first operational mode. The first operational mode is a delta-sigma based analog to digital converter. The group of switches are further selectable to configure the operational amplifier, the comparator, the first feedback capacitor and the second feedback capacitor in a second operational mode. The second operational mode is operation as a SAR based analog to digital converter.

This summary provides only a general outline of some embodiments according to the present invention. Many other objects, features, advantages and other embodiments of the present invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals are used throughout several drawings to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

DETAILED DESCRIPTION OF THE INVENTION

The present invention is related to data conversion, and more particularly to analog to digital converters.

Figure 1A:
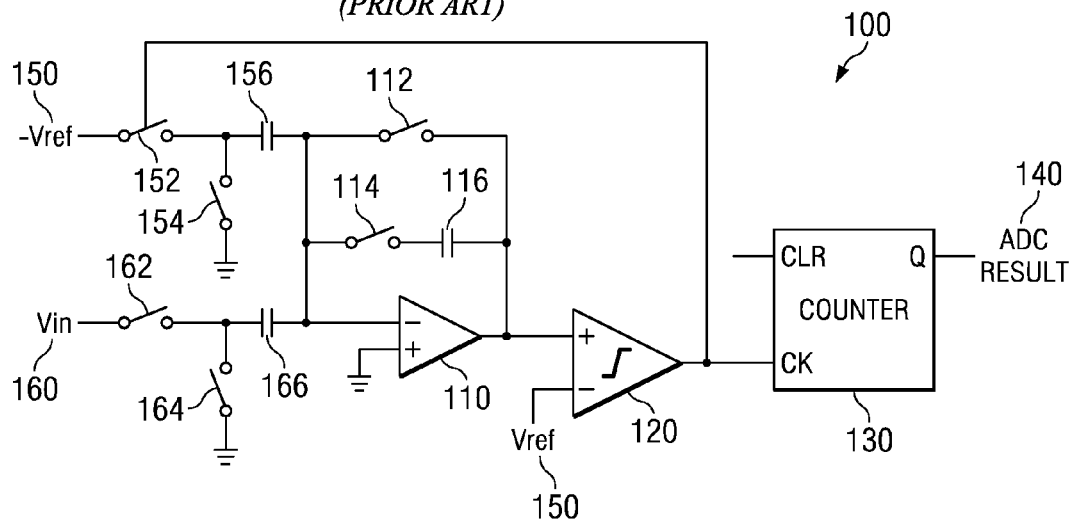
FIG. 1a depicts a conceptual prior art delta-sigma based analog to digital converter.
Figure 1B:
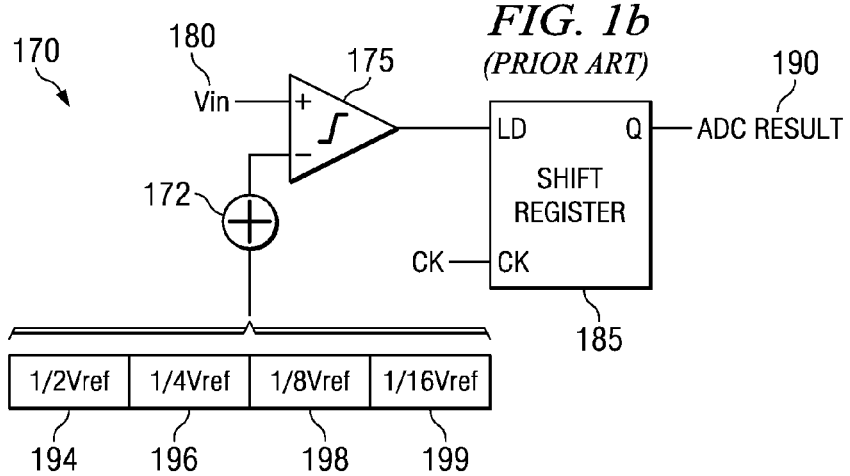
FIG. 1b depicts a conceptual prior art SAR based analog to digital converter.
Figure 2:
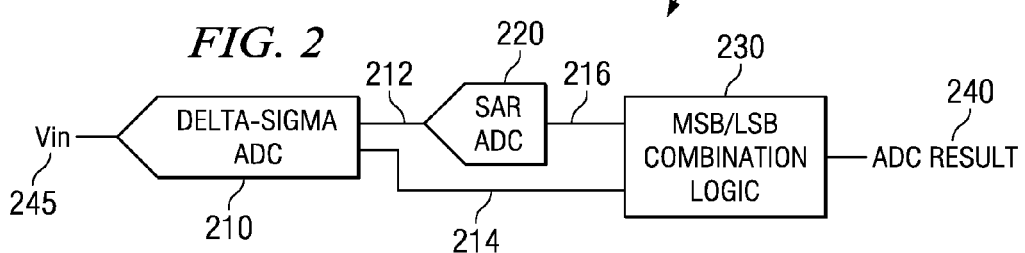
FIG. 2 shows a combined delta-sigma and SAR based analog to digital converter in accordance with various embodiments of the present invention.

Turning to FIG. 2, a combined delta-sigma and SAR (i.e., "Successive Approximation Register") based analog to digital converter 200 in accordance with various embodiments of the present invention is depicted. Analog to digital converter 200 includes a first stage delta-sigma analog to digital converter 210, a second stage SAR analog to digital converter 220, and a combination block 230. Delta-sigma analog to digital converter 210 receives a voltage input 245 that is to be sampled. Delta-sigma analog to digital converter 210 performs a delta-sigma based analog to digital conversion that provides a first portion of a conversion result 214 and a conversion residue 212. The first portion of the conversion result 214 and conversion residue 212 are formed using delta-sigma conversion techniques that are more fully discussed below in relation to FIG. 3b. Further, it should be noted that delta-sigma analog to digital converter 210 may be implemented as a variety of circuits capable of implementing a delta-sigma based analog to digital conversion. As one example, delta-sigma analog to digital converter 210 may be implemented using the circuit of FIG. 3b that is more fully discussed below. Based on the disclosure provided herein, one of ordinary skill in the art will recognize a variety of circuits that may be used to implement delta-sigma analog to digital converter 210 in accordance with one or more embodiments of the present invention.

SAR analog to digital converter 220 receives the conversion residue, and performs a SAR based analog to digital conversion on the residue. The conversion is provided as a second portion of the conversion result 216. The second portion of the conversion result 216 is formed using SAR conversion techniques that are more fully discussed below in relation to FIG. 3c. Further, it should be noted that SAR analog to digital converter 220 may be implemented as a variety of circuits capable of implementing a SAR based analog to digital conversion. As one example, SAR analog to digital converter 220 may be implemented using the circuit of FIG. 3c that is more fully discussed below. Based on the disclosure provided herein, one of ordinary skill in the art will recognize a variety of circuits that may be used to implement SAR analog to digital converter 220 in accordance with one or more embodiments of the present invention.

Both the first portion of the conversion result 214 and the second portion of the conversion result 214 are provided to a combination block 230. Combination block 230 includes circuitry that is capable of combining the first portion of the conversion result 214 with the second portion of the conversion result 216 to provide an ADC result 240. In some cases, Combination block 230 simply appends the first portion of the conversion result 214 to the second portion of the conversion result 216 with the first portion of the conversion result 214 constituting the most significant bits of ADC result 240, and the second portion of the conversion result 216 constituting the least significant bits of the ADC result 240. In other cases, combination block 230 includes a shift and add function that operates to align the least significant bits of the first portion of the conversion result 214 with the most significant bits of the second portion of the conversion result 216, and thereafter adds the first portion of the conversion result 214 to the second portion of the conversion result 216. Based on the disclosure provided herein, one of ordinary skill in the art will recognize a variety of functions that may be provided by combination block 230 and circuitry associated therewith that can be used to combine the aforementioned portions of the conversion result depending upon the particular characteristics of the portions of the conversion result and desired output.

In some embodiments of the present invention, a circuit topology is used that allows reuse of the analog components of a first order delta-sigma converter with an a few additional switches to create a hybrid delta-sigma/SAR analog to digital converter. Such a circuit topology provides an analog to digital converter that supports high resolution applications without the time and noise penalties incurred when either a delta-sigma converter or a SAR converter are used separately. In particular, by combining both delta-sigma and SAR based analog to digital conversion approaches to provide a unified conversion result, noise performance can be maintained while conversion time is reduced by two for each bit that is done with the cyclic SAR.

Figure 3A:
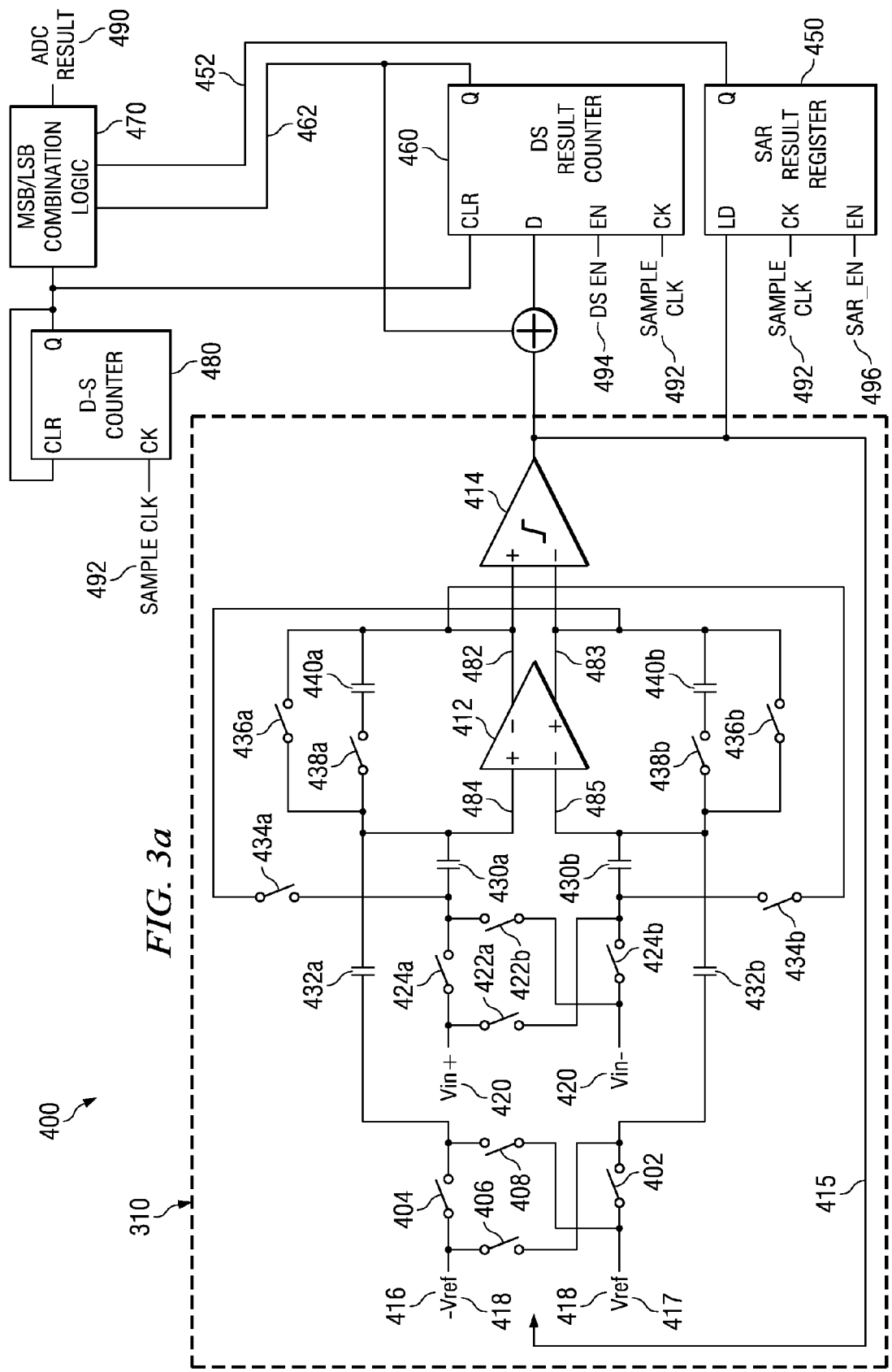
FIGS. 3a-3c show a circuit reconfigurable to perform a combination of delta-sigma and SAR based analog to digital converter in accordance with various embodiments of the present invention.
Figure 3B:
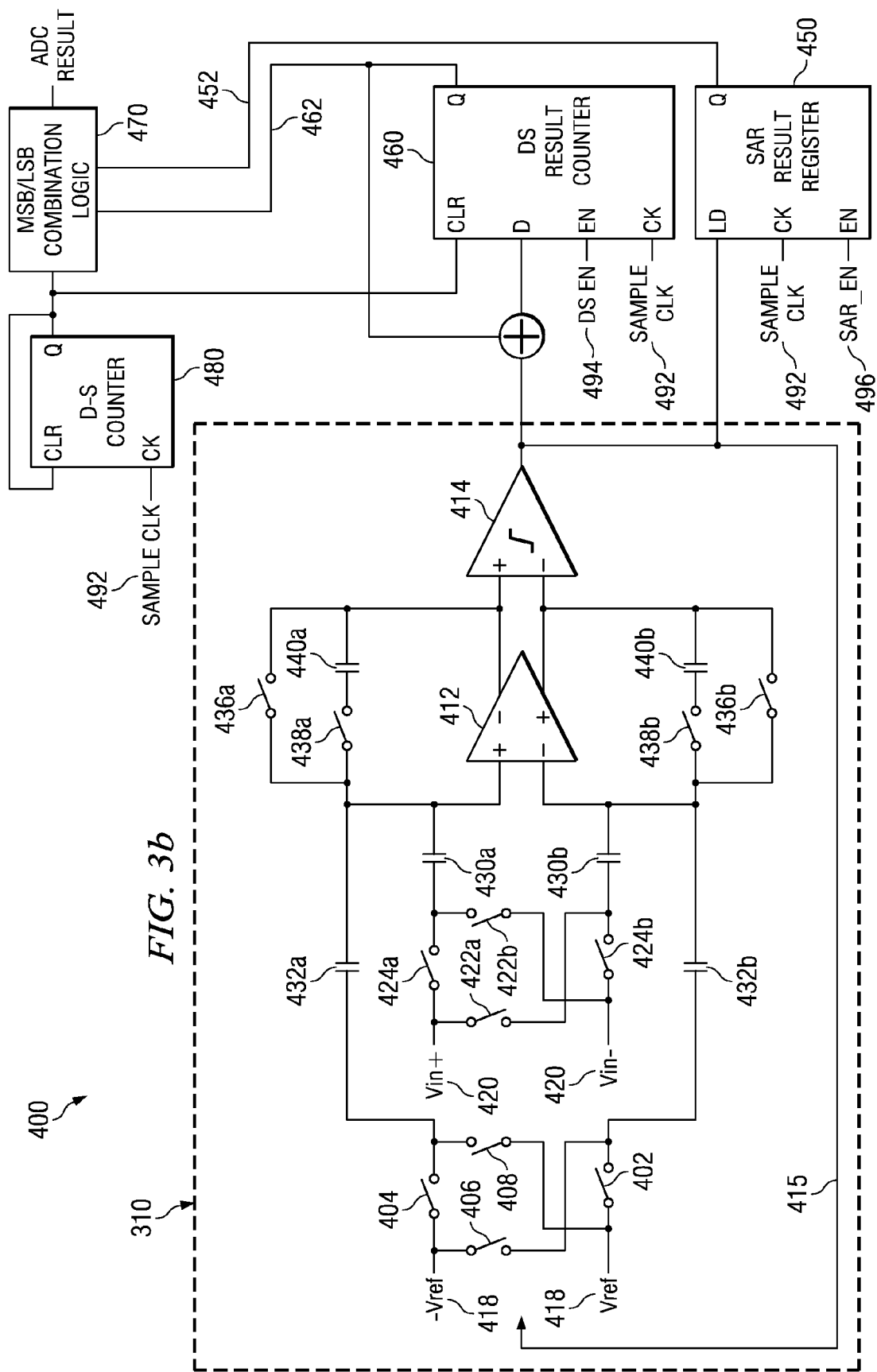
Figure 3C:
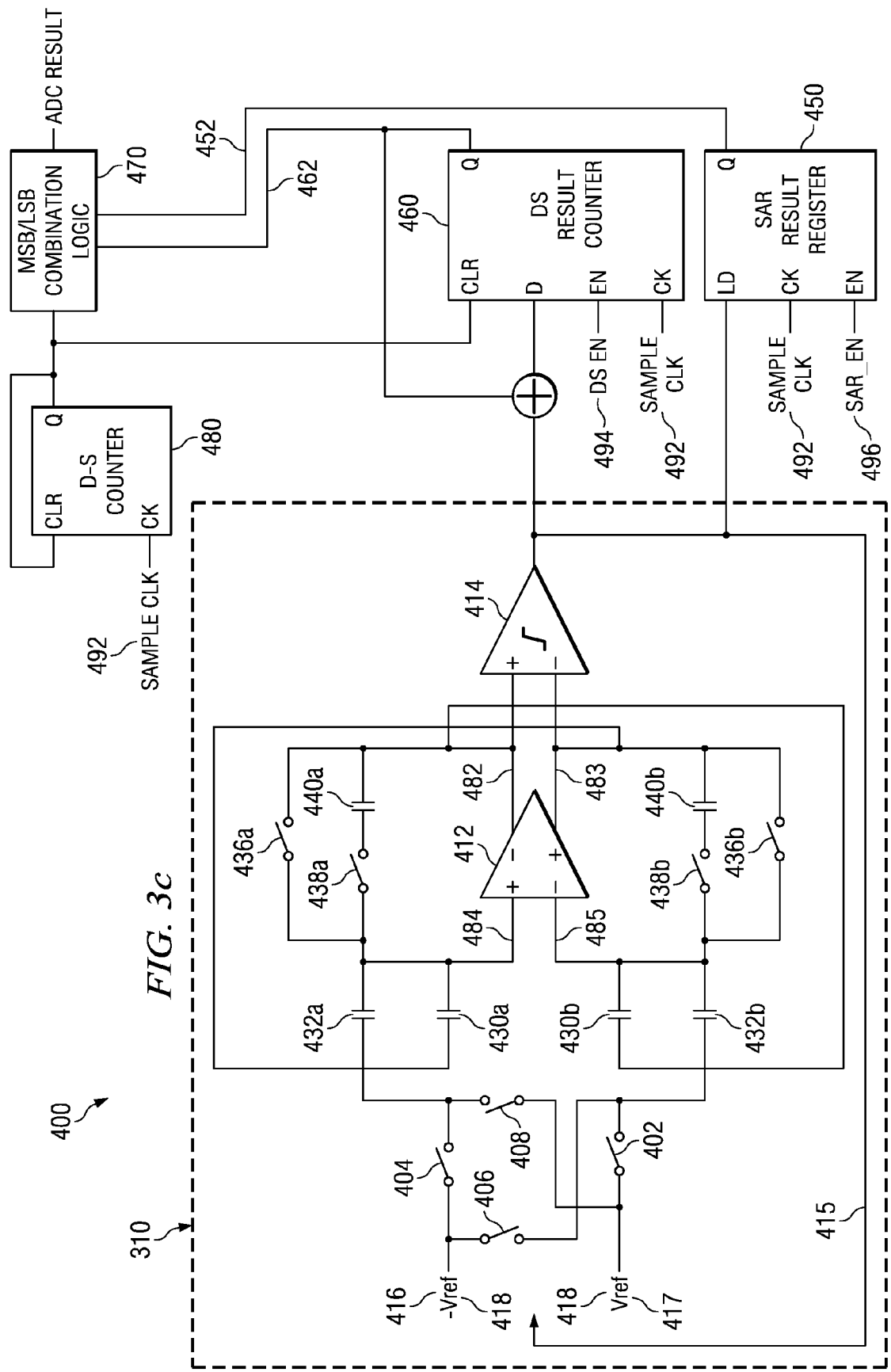

Turning to FIGS. 3a-3c, a reconfigurable analog to digital converter 300 capable of performing a combination of delta-sigma and SAR based analog to digital conversion is depicted in accordance with various embodiments of the present invention. As shown in FIG. 3a, analog to digital converter 300 includes a reconfigurable circuit 310 (outlined by a dashed line), a SAR result register 450, a delta-sigma result counter 460, a combination block 470, and a sample counter 480.

Reconfigurable circuit 310 includes groups of switches that allow for configuration as a delta-sigma analog to digital converter or a SAR analog to digital converter. When configured as a delta-sigma analog to digital converter, delta-sigma result counter 460 tallies the result of the conversion and provides a first portion of a conversion result 462 to combination block 470. Delta-sigma counter 480 is configured to count the appropriate number of samples to be processed during when configurable circuit 310 is configured as a delta-sigma analog to digital converter. As shown, delta-sigma counter 480 is self resetting once the appropriate number of samples are counted. In some cases, the number of delta-sigma samples is programmable. In such a case, counter 480 may be preloaded with a defined starting count. When the count is achieved, the first portion of the conversion result 462 from delta-sigma result counter 460 is provided to combination block 470, and delta-sigma result counter 460 is reset. Based on the disclosure provided herein, one of ordinary skill in the art will recognize a variety of circuitry that may be used to count a defined number of samples, and transfer a result count to an output register upon completion of a sampling period in accordance with some embodiments of the present invention.

When configured as a SAR analog to digital converter, SAR result register 450 receives the successive conversion results and provides a second portion of the conversion result 452 to combination block 470. In some cases, SAR result register 450 places the received result in a bit position corresponding to the magnitude of the result. SAR result register 450 provides the second portion of the conversion result 452 to combination block 470.

As discussed above, both the first portion of the conversion result 462 and the second portion of the conversion result 452 are provided to combination block 470. Combination block 470 includes circuitry that is capable of combining the first portion of the conversion result 462 with the second portion of the conversion result 452 to provide an ADC result 490. In some cases, combination block 470 simply appends the first portion of the conversion result 462 to the second portion of the conversion result 452 with the first portion of the conversion result 462 constituting the most significant bits of ADC result 490, and the second portion of the conversion result 452 constituting the least significant bits of the ADC result 490. In other cases, combination block 470 includes a shift and add function that operates to align the least significant bits of the first portion of the conversion result 462 with the most significant bits of the second portion of the conversion result 452, and thereafter adds the first portion of the conversion result 462 to the second portion of the conversion result 452. Based on the disclosure provided herein, one of ordinary skill in the art will recognize a variety of functions that may be provided by combination block 470 and circuitry associated therewith that can be used to combine the aforementioned portions of the conversion result depending upon the particular characteristics of the portions of the conversion result and desired output.

Reconfigurable circuit 310 includes a voltage reference 418 that is capable of providing a negative polarity voltage reference 416 and a positive polarity voltage reference 417. Both of the aforementioned voltage references are switched into reconfigurable circuit 310 using switches 402, 404, 406, 408. It should be noted that various other circuits using fewer switches may be implemented in accordance with one or more embodiments of the present invention that allow for switching positive and negative voltage references into a circuit. Negative voltage reference 416 is electrically coupled to a reference sample capacitor 432a via a switch 404, and to a reference sample capacitor 432b via a switch 406. Positive voltage reference 417 is electrically coupled to reference sample capacitor 432a via a switch 408, and to reference sample capacitor 432b via a switch 402.

A positive side of a differential voltage input 420 is electrically coupled to an input sample capacitor 430a via a switch 424a, and to an input sample capacitor 430b via a switch 422a. A negative side of differential voltage input 420 is electrically coupled to input sample capacitor 430a via a switch 422b, and to input sample capacitor 430b via a switch 424b. In addition, input sample capacitor 430a is electrically coupled to a positive output 483 of a differential operational amplifier 412 via a switch 434a, and input sample capacitor 430b is electrically coupled to a negative output 482 of differential operational amplifier 412 via a switch 434b. The other side of input sample capacitor 430a is electrically coupled to a positive input 484 of differential operational amplifier 412, to negative output 482 via a switch 436a, and to negative output 482 via a switch 438a and a feedback capacitor 440a. The other side of input sample capacitor 430b is electrically coupled to a negative input 485 of differential operational amplifier 412, to positive output 483 via a switch 436b, and to positive output 483 via a switch 438b and a feedback capacitor 440b. Negative output 482 of differential operational amplifier 412 is electrically coupled to a positive input of a differential comparator 414, and positive output 483 is electrically coupled to a negative input of differential comparator 414.

As an overview of the operation of analog to digital converter 400, a set amount of samples are taken when analog to digital converter 400 is configured for delta-sigma analog to digital conversion leaving a residue charge on feedback capacitors 440. The conversion residue on the integrator at the end of a fixed number of cycles is further sampled by configuring analog to digital converter 400 as a SAR analog to digital converter. Doing such increases resolution without the dramatic increase in conversion time required where a delta-sigma converter is used alone. A recursive SAR analog to digital converter is created by disconnecting the input sample capacitors 430 from differential voltage input 420, and reusing the capacitors to create a gain of two on the integrator including differential operational amplifier 412.

In some embodiments of the present invention, there is a programmable tradeoff between the time spent developing a conversion result using a delta-sigma approach and the time spent developing the conversion result using a SAR approach. Programmability to trade off conversion time versus noise performance and power is now dependent on the following:

Resolution: N bits=n+m, where n equals the number of delta-sigma bits in the final result and m equals the number of SAR bits in the result; and Total Number of Samples Required to Produce the Result=$2^n$+m.

Configuring reconfigurable circuit 310 as a delta sigma analog to digital converter includes opening switches 434 as shown in FIG. 3b. Turning to FIG. 3b, while operating as a delta sigma analog to digital converter, switches 424 are closed, switches 422 are opened, switches 436 are closed and switches 438 are opened. This configuration provides a sample phase where a charge corresponding to differential voltage input 420 is stored on input sample capacitors 430. In the next phase, switches 424 are opened, switches 422 are closed, switches 436 are opened and switches 438 are closed. This causes the charge from input sample capacitors 430 to transfer to feedback capacitors 440. The aforementioned sample phase and integration phase may be accomplished on succeeding edges (using both positive and negative edges) of a clock, on succeeding negative edges of the clock, or on succeeding positive edges of the clock.

Transferring the charge from input sample capacitors 430 to feedback capacitors 440 results in an output from differential operational amplifier 412 at the input of differential comparator 414. The output of differential operational amplifier 412 is processed by differential comparator 414 to produce either a logic '1' or a logic '0' depending upon positive output 483 of differential operational amplifier 412 relative to negative output 482 of differential operational amplifier 412. Where the result is a logic '0', result counter 460 is not incremented. On the next pass, switches 402, 404, 406, 408 are configured such that voltage reference 418 is not sampled via reference sample capacitors 432 under the direction of feedback 415 (it should be noted that differential input voltage 420 is still sampled on the next pass). Alternatively, on any pass where the result of the comparison is a logic '1', result counter 460 is incremented. It should be noted that incrementing delta-sigma result counter 460 is only enabled when the circuit is operating as a delta-sigma circuit as indicated by DS EN 494, and thus delta-sigma result counter 460 is not incremented during the SAR operational mode. Further, where the result is a logic '1', switches 402, 404, 406, 408 are configured such that negative voltage reference 416 is sampled via reference sample capacitors 432 along with differential input voltage 420. Over a number of sampling periods, the digital value representing the voltage at differential voltage input 420 is that maintained on result counter 460.

The discussion in the preceding paragraph applies to the single application as shown. In contrast, where a window comparator is used one of three results is possible: (1) above an upper threshold, (2) between an upper and lower threshold, and (3) below the lower threshold. Where the result is above the upper threshold, result counter 460 is incremented, and on the next pass voltage reference 418 is sampled in a negative polarity along with differential voltage input 420. Where the result is above a lower threshold and below an upper threshold, voltage reference 418 is not sampled and result counter 460 is not incremented. Where the result is below a lower threshold, result counter 460 is decremented, and on the next pass voltage reference 418 is sampled in a positive polarity along with differential voltage input 420.

Increasing the number of samples processed results in a greater resolution on delta-sigma result counter 460. At some point, however, a very large number of iterations are required to gain one additional bit of resolution. For example, approximately one thousand iterations are required to increase from ten to eleven bits of resolution. Thus, in some embodiments of the present invention, after a certain resolution is achieved (as indicated by delta-sigma sample counter 480) through use of delta-sigma based analog to digital conversion, one or more of the switches of reconfigurable circuit 410 are selected such that operation as a SAR analog to digital converter is enabled to convert the remaining conversion residue (i.e., the charge remaining on feedback capacitors 440 at the end of operating as a delta-sigma analog to digital converter).

Configuring reconfigurable circuit 310 as a SAR based analog to digital converter includes closing switches 434, and opening switches 422 and switches 424 as shown in FIG. 3c. Turning to FIG. 3c, while operating as a SAR analog to digital converter, the residue charge remaining after the previously described delta-sigma operation is stored on feedback capacitors 440, and differential voltage input 420 is no longer sampled (i.e., switches 422 and switches 424 are opened). Switches 436 are closed causing input sample capacitors 430 to discharge (assuming there is no offset to differential operational amplifier 412). Then, switches 436 are opened and switches 438 are closed while switches 402, 404, 406, 408 remain open. With switches 438 closed, the charge originally maintained on feedback capacitors 440 is redistributed as differential operational amplifier 412 tries to drive the difference between positive input 484 of differential operational amplifier 412 and negative input 485 to zero.

In performing the aforementioned charge redistribution, a gain (i.e., $C_{in}/C_{out}$) controlled by the ratio of input sample capacitors 430 and feedback capacitors 440 is applied to the voltage seen at the output of differential operational amplifier 412. Initially, the residue charge left after conversion in delta-sigma mode is:

$$Q_{init} = Q_{c440a(t=0)} + Q_{c440b(t=0)},$$

where $Q_{c1(t=0)}$ is the residue on feedback capacitor 440a and $Q_{c2(t=0)}$ is the residue charge on feedback capacitor 440b. After closing switches 438 and opening switches 436, the charge redistributes in accordance with the following equations:

$$Q_{c440a} = Q_{c440a(t=0)} + Q_{c430a}$$

$$Q_{c440b} = Q_{c440b(t=0)} + Q_{c430b}$$

where $Q_{c1}$ is the new charge on feedback capacitor 440a and $Q_{c2}$ is the new charge on feedback capacitor 440b. The following derivation demonstrates the selection of the capacitance of input sample capacitors 430 in relation to feedback capacitors 440 to provide the desired SAR operational characteristics:

$$Q_{c430b} = V_{c440a} * C_{430b} = \frac{Q_{c440a}}{C_{440a}} * C_{430b} \therefore Q_{c430a} = \frac{Q_{c440b}}{C_{440b}} * C_{430a}$$

$$Q_{c440a} = Q_{c440a(t=0)} + \frac{Q_{c440b}}{C_{440b}} * C_{430a}$$

$$Q_{c440b} = Q_{c440b(t=0)} + \frac{Q_{c440a}}{C_{440a}} * C_{430b}$$

$$Q_{c440a} = Q_{c440a(t=0)} + \frac{Q_{c440b(t=0)} + \frac{Q_{c440a}}{C_{440a}} * C_{430b}}{C_{440b}} * C_{430a}$$

$$Q_{c440a} = \left( \frac{Q_{c440a(t=0)} + \frac{Q_{c440b(t=0)} * C_{430a}}{C_{440b}}}{C_{440a} * C_{440b} - C_{430a} * C_{430b}} \right) * C_{440a} * C_{440b}$$

Based on the preceding derivation, if input sample capacitors 430 are chosen to be equal and feedback capacitors 440 are each chosen to be equal to twice the corresponding input sample capacitor 430, then the following equations define the charge buildup on feedback capacitors 440 during the aforementioned charge redistribution:

$$Q_{c440a} = \frac{4}{3} Q_{c440a(t=0)} + \frac{2}{3} Q_{c440b(t=0)} \therefore Q_{c440b} = \frac{4}{3} Q_{c440b(t=0)} + \frac{2}{3} Q_{c440a(t=0)},$$

from this, the final charge is represented by the following equation:

$$Q_{Final} = Q_{c440a} + Q_{c440b} = 2 * Q_{c440a(t=0)} + 2 * Q_{c440b(t=0)},$$

and thus a gain of two for differential operational amplifier 412.

As previously stated, negative output 482 of differential operational amplifier 412 is electrically coupled to a positive input of a differential comparator 414, and positive output 483 is electrically coupled to a negative input of differential comparator 414. The output of differential comparator 414 is provided to SAR result register 450 that places each output in a particular bit position corresponding to the sample period in which the output corresponds (i.e., which bit the output is to assume in the final result). Further, differential comparator 414 drives feedback 415 that controls switches 402, 404, 406, 408 in the application of the appropriate polarity of voltage reference 418 depending upon the output of differential comparator 414.

Differential comparator 414 may be configured for unipolar function (i.e., to function as a single comparator operable to detect an over-threshold or under-threshold condition) to process the residue charge left on feedback capacitors 440. Similarly, two comparators may be used in place of differential comparator 414 to provide bipolar functionality (i.e., to function as two comparators operable to detect excess of an upper threshold, detect less than a lower threshold, or detect a condition between the upper and lower thresholds).

Where unipolar functionality is used (i.e., that shown in FIG. 3a), a single comparator is used to process the residue charge left on feedback capacitors 440. The process for unipolar functionality is represented by the following set of equations implemented on a first operational cycle:

If(Vresidue>Vthreshold)then Vout1 =2*(Vresidue–Vref) Else Vout1 =2*(Vresidue).

The augmentation by negative voltage reference 416 (i.e., –Vref) is controlled by properly selecting the positions of switches 402, 404, 406, 408 as directed by feedback 415. During the next operational cycle, the operation is described by the following equation regardless of the output of differential comparator 414:

Vout2=(Vout1+Vref).

In this pass, the analog to digital converter is configured in the delta-sigma mode similar to that shown in FIG. 3b so that a gain of two does not occur, yet the differential voltage input 420 is still not sampled. It should be noted that for the aforementioned unipolar operation, one bit of resolution is generated for each two SAR cycles.

For bipolar functionality (not shown) there are three possible comparator states generated through use of two comparators: (1) above an upper threshold, (2) below a lower threshold, or (3) between the upper and lower thresholds. In this case, only a single SAR cycle is used to create a bit of resolution as described by the following equations:

If(Vresidue>+Vthreshold)Then Vout=2*(Vresidue–Vref) Else If(Vresidue<–Vthreshold)Then Vout=2*(Vresidue+Vref) Else Vout=2*(Vresidue).

It should be noted that other processing approaches in addition to the aforementioned unipolar and bipolar approaches may be used in accordance with one or more embodiments of the present invention. For example, a single comparator circuit may be implemented such that only one half of Vref is sampled. In such an approach, a single comparator may be used in a circuit that produces one bit of resolution for each SAR cycle.

The previously described process of multiplying the conversion residue (in some cases after adding or subtracting the voltage reference) and comparing may be repeated until a desired resolution of the second portion of the conversion result 452 is achieved. As previously discussed, the first portion of the conversion result 462 and the second portion of the conversion result are then combined in combination block 470 to produce ADC result 490. Once the last bit is derived from reconfigurable circuit 310 operating as a SAR analog to digital converter to produce ADC result 490, reconfigurable circuit 310 may again be configured to operate as a delta-sigma analog to digital converter as depicted in FIG. 3b. From this point, differential voltage input 420 is again sampled using the delta-sigma analog to digital converter, and the residue of that conversion is processed using a SAR analog to digital conversion.

Figure 4:
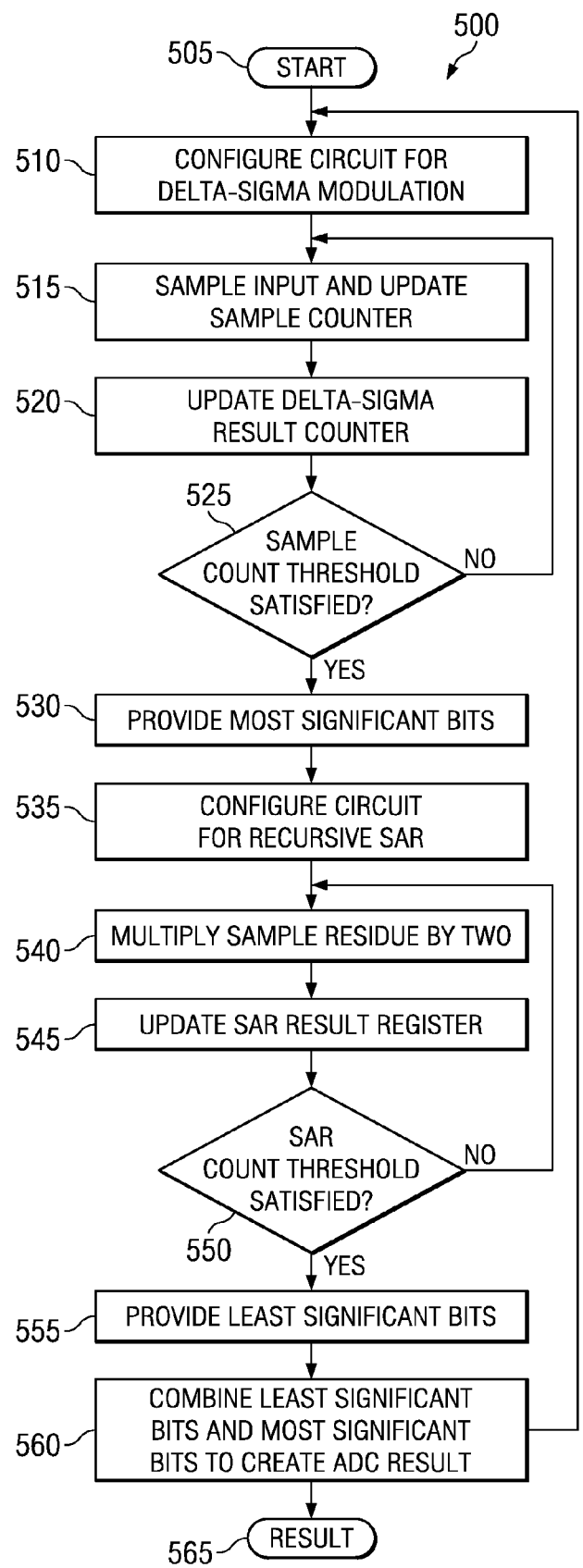
FIGS. 4 and 5 are flow diagrams showing methods in accordance with embodiments of the present invention for performing analog to digital conversion.

Turning to FIG. 4, a flow diagram 500 shows a method in accordance with embodiments of the present invention for performing analog to digital conversion. Following flow diagram 500, a conversion process is started (block 505) by configuring a reconfigurable analog to digital conversion circuit to operate as a delta-sigma analog to digital converter (block 510). This may include setting one or more switches as discussed in relation to FIG. 3 above. With the circuit thus configured (block 510), a voltage input is sampled and the sample counter is incremented (block 515). Based on the sample, the delta-sigma result counter is updated (block 520). It is then determined if a predefined number of samples have been processed (block 525). Where the predefined number of samples have not yet been processed (block 525), the processes of blocks 515-525 are repeated.

Otherwise, where the predefined number of samples have been processed (block 525), the most significant bits of a conversion result are provided to a register (block 530). Further, the reconfigurable analog to digital conversion circuit is configured to operate as a SAR analog to digital converter (block 535). With the circuit thus configured (block 535), the sample residue left over from the prior delta-sigma process is multiplied by two (block 540). The multiplied sample residue is compared with a voltage reference, the result of the comparison is used to update a SAR result register, and a sample count is incremented (block 545). The sample count is compared to a SAR count threshold (block 550). Where the sample count is less than the SAR count threshold (block 550), the processes of blocks 540, 545, 550 are repeated.

Alternatively, where the sample count is equal to the SAR count threshold (block 550), the least significant bits of the conversion result are provided to a register (block 555). Next, the most significant bits and the least significant bits of the conversion result are combined to create a final ADC result (block 560). This process generates a result (block 565) that may be done by appending the two sets of bits, or by shifting and adding the two sets of bits depending upon the conversion process used.

Figure 5:
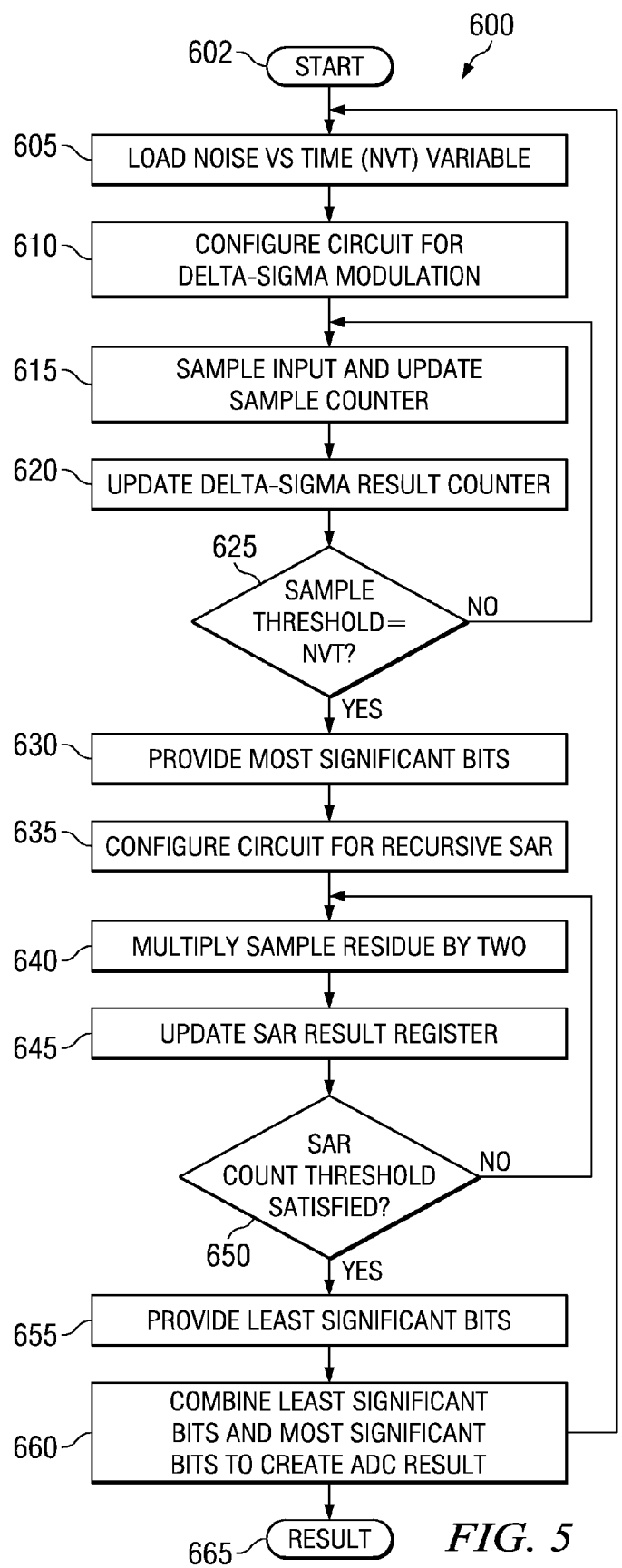

Turning to FIG. 5, a flow diagram 600 shows a method in accordance with embodiments of the present invention for performing analog to digital conversion where the number of delta-sigma bits and the number of SAR bits in the final result is programmable. Following flow diagram 600, a conversion process is started (block 602) by loading a noise verses time variable (NVT) (block 605). As discussed below, NVT controls the number of delta-sigma analog to digital conversion iterations compared to the number of SAR analog to digital conversion iterations that are performed. In a typical implementation, a defined resolution for a final analog to digital conversion result is produced. NVT controls the amount of delta-sigma vs. SAR iterations used to produce the resolution.

A reconfigurable analog to digital conversion circuit is configured to operate as a delta-sigma analog to digital converter (block 610). This may include setting one or more switches as discussed in relation to FIG. 3 above. With the circuit thus configured (block 610), a voltage input is sampled and the sample counter is incremented (block 615). Based on the sample, the delta-sigma result counter is updated (block 620). It is then determined if a set number of bits for a final conversion result have been produced using the delta-sigma conversion process (block 625). Where the predefined number of samples have not yet been processed (block 625), the processes of blocks 615-625 are repeated.

Otherwise, where the predefined number of samples have been processed (block 625), the most significant bits of a conversion result are provided to a register (block 630). Further, the reconfigurable analog to digital conversion circuit is configured to operate as a SAR analog to digital converter (block 635). With the circuit thus configured (block 635), the sample residue left over from the prior delta-sigma process is multiplied by two (block 640). The multiplied sample residue is compared with a voltage reference, the result of the comparison is used to update a SAR result register, and a sample count is incremented (block 645). The sample count is compared to a total desired resolution of the final conversion results less the $Log_2(NVT)$ (block 650). Where the sample count is less than the prescribed number of bits (block 650), the processes of blocks 640, 645, 650 are repeated.

Alternatively, where the sample count is equal to the prescribed number of bits (block 650), the least significant bits of the conversion result are provided to a register (block 655). Next, the most significant bits and the least significant bits of the conversion result are combined to create a final ADC result (block 660). This process generates a result (block 665) that may be done by appending the two sets of bits, or by shifting and adding the two sets of bits depending upon the conversion process used.

Based on the disclosure provided herein, one of ordinary skill in the art will recognize a number of advantages that may be achieved through use of one or more of the systems, circuits and methods discussed herein. For example, a hybrid analog to digital converter such as that described in relation to FIGS. 2-3 is able to reduce conversion time while maintaining a reasonable noise performance. As shown in FIG. 3a, such a hybrid circuit may be implemented through reuse of various analog circuitry. This results in substantial area and power savings. One of ordinary skill in the art will recognize other advantages.

In conclusion, the present invention provides novel systems, devices, methods for data conversion. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. An analog to digital converter, wherein the analog to digital converter includes a first stage and a second stage, wherein the first stage provides a first result and a residue, wherein the first stage operates as a delta-sigma based analog to digital converter, wherein the second stage receives the residue and provides a second result, wherein the second stage operates as a Successive Approximation Register based analog to digital converter, wherein the first stage includes an operational amplifier and a comparator, wherein an output of the operational amplifier is electrically coupled to an input of the comparator, and wherein the second stage reuses the same operational amplifier and comparator.

2. The analog to digital converter of claim 1, wherein the Successive Approximation Register based analog to digital converter produces a single bit of resolution for each Successive Approximation Register cycle.

3. The analog to digital converter of claim 2, wherein the Successive Approximation Register based analog to digital converter utilizes a window comparator.

4. The analog to digital converter of claim 1, wherein the Successive Approximation Register based analog to digital converter produces a single bit of resolution for each two Successive Approximation Register cycles.

5. The analog to digital converter of claim 4, wherein the Successive Approximation Register based analog to digital converter utilizes a single threshold comparator.

6. The analog to digital converter of claim 1, wherein the first stage includes an input capacitor and a feedback capacitor, and wherein the second stage reuses the same input capacitor and feedback capacitor.

7. The analog to digital converter of claim 6, wherein the second stage exhibits a positive feedback with a gain based on a ratio of the input capacitor and the feedback capacitor.

8. The analog to digital converter of claim 1, wherein the operational amplifier is a differential operational amplifier, and wherein the comparator is a differential comparator.

9. The analog to digital converter of claim 1, wherein the first stage includes a result counter, wherein an output of the comparator drives the result counter, wherein the second stage includes a result register, and wherein the output of the comparator drives the result register.

10. A method for performing analog to digital conversion, the method comprising:
    performing a first analog to digital conversion using a delta-sigma based analog to digital converter, wherein the delta-sigma converter provides a first portion of a conversion result and a conversion residue;
    performing a second analog to digital conversion using a Successive Approximation Register based analog to digital converter, wherein the Successive Approximation Resister based analog to digital converter operates on the conversion residue and provides a second portion of the conversion result; and
    combining the first portion of the conversion result with the second portion of the conversion result to produce a combined conversion result;
    wherein combining the first portion of the conversion result with the second portion of the conversion result includes performing a process selected from the group consisting of:
    identifying the first portion of the conversion result as the most significant bits of the combined conversion result and identifying the second portion of the conversion result as the least significant bits of the combined conversion result; and
    adding the first portion of the conversion result to the second portion of the conversion result, and wherein adding the first portion of the conversion result to the second portion of the conversion result includes shifting such that one or more most significant bits of the second portion of the conversion result are added to one or more least significant bits of the first portion of the conversion result.

11. A method for performing analog to digital conversion, the method comprising:
    performing a first analog to digital conversion using a delta-sigma based analog to digital converter, wherein the delta-sigma converter provides a first portion of a conversion result and a conversion residue:
    performing a second analog to digital conversion using a Successive Approximation Resister based analog to digital converter, wherein the Successive Approximation Register based analog to digital converter operates on the conversion residue and provides a second portion of the conversion result; and combining the first portion of the conversion result with the second portion of the conversion result to produce a combined conversion result;

wherein performing the first analog to digital conversion using the delta-sigma based analog to digital converter includes performing a number of analog to digital conversion iterations, and wherein the number of analog to digital conversion iterations is greater than a number of bits in the combined conversion result.

12. The method of claim 11, wherein performing the second analog to digital conversion using the Successive Approximation Register based analog to digital converter includes performing a number of analog to digital conversion iterations, wherein the number of analog to digital conversion iterations is less than the number of bits in the combined conversion result.

13. The method of claim 12, wherein the number of Successive Approximation Register iterations is programmable.

14. The method of claim 11, wherein the number of delta-sigma iterations is programmable.

15. A method for performing analog to digital conversion, the method comprising:

performing a first analog to digital conversion using a delta-sigma based analog to digital converter, wherein the delta-sigma converter provides a first portion of a conversion result and a conversion residue;

performing a second analog to digital conversion using a Successive Approximation Register based analog to digital converter, wherein the Successive Approximation Register based analog to digital converter operates on the conversion residue and provides a second portion of the conversion result;

combining the first portion of the conversion result with the second portion of the conversion result to produce a combined conversion result; and providing a differential analog to digital conversion circuit, wherein the differential analog to digital conversion circuit is configurable as a delta-sigma based analog to digital converter, and wherein the differential analog to digital conversion circuit is configurable as a Successive Approximation Register based analog to digital converter.

16. The method of claim 15, wherein the differential analog to digital conversion circuit includes a differential comparator and a differential operational amplifier, and wherein the differential comparator and the differential operational amplifier are used in both the delta-sigma based analog to digital convener and the Successive Approximation Register based analog to digital converter.

17. A analog to digital converter, the analog to digital converter comprising:

a differential operational amplifier;

a differential comparator, wherein an output of the differential operational amplifier is electrically coupled to an input of the differential comparator;

a first feedback capacitor and a second feedback capacitor; and a group of switches, wherein the group of switches are selectable to configure the differential operational amplifier, the differential comparator, the first feedback capacitor, and the second feedback capacitor in a first operational mode; wherein the first operational mode is a delta-sigma based analog to digital converter; wherein the group of switches are further selectable to configure the differential operational amplifier, the differential comparator, the first feedback capacitor, and the second feedback capacitor in a second operational mode; and wherein the second operational mode is operation as a Successive Approximation Register based analog to digital converter.

18. The analog to digital converter of claim 17, wherein the Successive Approximation Register based analog to digital converter produces an output selected from a group consisting of: a single bit of resolution for each Successive Approximation Register cycle, and a single bit of resolution for each two Successive Approximation Register cycles.

19. The analog to digital converter of claim 17, wherein the Successive Approximation Register based analog to digital converter utilizes a comparator selected from a group consisting of: a window comparator, and a single threshold comparator.

20. The analog to digital converter of claim 17, wherein the first stage includes a first input capacitor and a second input capacitor, and wherein the second stage reuses at least part of the first input capacitor and at least part of the second input capacitor.

21. The analog to digital converter of claim 20, wherein the second stage exhibits a positive feedback with a gain based on a ratio of the first input capacitor and the first feedback capacitor.

* * * * *